United States Patent
Lebouitz et al.

(10) Patent No.: US 7,638,435 B2
(45) Date of Patent: Dec. 29, 2009

(54) PULSED ETCHING COOLING

(75) Inventors: Kyle S. Lebouitz, Pittsburgh, PA (US);
David L. Springer, Pittsburgh, PA (US)

(73) Assignee: Xactix, Inc., Pittsburgh, PA (US)

( * ) Notice: Subject to any disclaimer, the term of this patent is extended or adjusted under 35 U.S.C. 154(b) by 0 days.

(21) Appl. No.: 12/064,370

(22) PCT Filed: Aug. 23, 2006

(86) PCT No.: PCT/US2006/033066
§ 371 (c)(1),
(2), (4) Date: Feb. 21, 2008

(87) PCT Pub. No.: WO2007/025039
PCT Pub. Date: Mar. 1, 2007

(65) Prior Publication Data
US 2008/0207001 A1  Aug. 28, 2008

Related U.S. Application Data

(60) Provisional application No. 60/710,444, filed on Aug. 23, 2005.

(51) Int. Cl.
*H01L 21/302* (2006.01)

(52) U.S. Cl. .......... 438/706; 438/715; 216/58; 216/73

(58) Field of Classification Search .......... 216/58, 216/63, 73, 74, 79; 438/689, 706, 714, 715, 438/719
See application file for complete search history.

(56) References Cited

U.S. PATENT DOCUMENTS

| 4,447,904 | A | * | 5/1984 | Burnham | 372/45.01 |
| 4,897,709 | A | * | 1/1990 | Yokoyama et al. | 257/301 |
| 6,077,451 | A | * | 6/2000 | Takenaka et al. | 216/79 |

(Continued)

OTHER PUBLICATIONS

Williams, Kirt Reed, "Micromachined Hot-Filament Vacuum Devices," PhD Dissertation, U.C. Berkley, May 1997, pp. 342-416.

(Continued)

*Primary Examiner*—Kin-Chan Chen
(74) *Attorney, Agent, or Firm*—The Webb Law Firm

(57) ABSTRACT

In an apparatus and method of vapor etching, a sample (S) to be etched is located in a main chamber (107) from which the atmosphere inside is evacuated. Etching gas is input into the main chamber (107) for a first period of time. Thereafter, the etching gas is evacuated from the main chamber (107) and cooling/purging gas is input into the main chamber for a second interval of time. Thereafter, the cooling/purging gas is evacuated from the main chamber (107). Desirably, the steps of inputting the etching gas into the main chamber (107) for the first period of time, evacuating the etching gas from the main chamber, inputting the cooling/purging gas into the main chamber (107) for the second period of time, and evacuating the cooling/purging gas from the main chamber are repeated until samples have been etched to a desired extent.

6 Claims, 1 Drawing Sheet

U.S. PATENT DOCUMENTS

| | | |
|---|---|---|
| 6,290,864 B1 | 9/2001 | Patel et al. |
| 6,409,876 B1 | 6/2002 | McQuarrie et al. |
| 6,436,229 B2 * | 8/2002 | Tai et al. ................. 156/345.18 |
| 6,536,410 B1 * | 3/2003 | Nehse ................... 123/406.24 |
| 6,887,337 B2 * | 5/2005 | Lebouitz et al. .......... 156/345.1 |
| 6,949,202 B1 * | 9/2005 | Patel et al. .................... 216/58 |
| 2001/0002663 A1 * | 6/2001 | Tai et al. ....................... 216/79 |
| 2002/0033229 A1 * | 3/2002 | Lebouitz et al. ............. 156/345 |
| 2002/0195423 A1 * | 12/2002 | Patel et al. .................... 216/73 |

OTHER PUBLICATIONS

Flamm et al., "XeF$_2$ and F-Atom Reactions with Si: Their Significance on Plasma Etching," Solid State Technology, Apr. 1983, 4, p. 117-121.

Chu et al., "Controlled Pulse-Etching with Xenon Difluoride," 1997 International Conference on Solid State Sensors and Actuators, Transducers, Jun. 16-19, 1997, 4 pages, Chicago, USA.

* cited by examiner

PULSED ETCHING COOLING

BACKGROUND OF THE INVENTION

1. Field of the Invention

The present invention relates to vapor etching of samples and, more particularly, to vapor etching of semiconductor materials.

2. Description of Related Art

Vapor etching of semiconductor materials and/or substrates is accomplished using gases such as xenon difluoride. Specifically, in xenon difluoride etching, the xenon difluoride gas reacts with solid materials, such as silicon and molybdenum, such that the materials are converted to a gas phase. This removal of these materials is known as etching.

Typically, with gas phased etching, especially in case of xenon difluoride etching, the reaction is exothermic or creates heat. This heat will cause a temperature increase on the part being etched. The part being etched is referred to as the sample. Increased temperature can influence critical parameters such as etching rate, or speed of etching, and selectivity, which is the relative rate that the material desired to be etched etches relative to a material that is desired to remain. Also, increased temperatures can lead to problems such as destroying sensitive materials, such as polymers.

A common approach to xenon difluoride etching is through the pulsed method of etching. In this mode, xenon difluoride is sublimated from a solid to a gas in an intermediate chamber, referred to as an expansion chamber, which can then be mixed with other gases. The gas(es) in the expansion chamber can then flow into an etching chamber to etch the sample, referred to as tie etching step. The main chamber is then emptied through a vacuum pump. This cycle, including the etching step, is referred to as an etching cycle. These cycles are repeated as necessary to achieve the desired amount of etching.

It should be noted that any heat that occurs during the etching will raise the temperature of the sample. By simply evacuating the chamber at the end of the etching cycle and repeating the cycle, there is little opportunity for the sample to return to its original temperature. This is in part due to the fact that the evacuation of the chamber, which by definition is reducing the number of gas molecules inside of the chamber, reduces the thermal conductivity of the gases inside of the chamber. Therefore, generally, each etching cycle will cause the sample to continually increase in temperature. It has been observed that increased temperature has resulted in reduced selectivity of silicon versus low-pressure chemical vapor deposited silicon nitride. Silicon nitride is a very common material in semiconductor or microelectromechanical systems devices and, in most cases, minimizing attack on silicon nitride when etching silicon is highly desirable.

Reduced selectivity of silicon versus other materials, including silicon nitride has also been attributed to the presence of the products of the etching process. These products of the reaction, such as silicon tetrafluoride, attack the non silicon materials reducing the selectivity.

SUMMARY OF THE INVENTION

The present invention reduces or avoids the continual temperature changes of a sample being etched due to successive etching cycles and periodically flushes products of reaction from the chamber. The invention includes adding another step between each etching step which acts to increase thermal conduction between the sample and the etching chamber in which the sample is etched. Specifically, after each etching cycle, the etching chamber is filled with a cooling/purging gas to increase thermal conduction. The gas can be any inert gas such as, without limitation, helium, nitrogen, or argon. The use of a mixture of such inert gases is also envisioned. As used herein, the phrase "inert" gas refers to any gas that minimally reacts with the etching chemistry. The inert gas or gases is referred to herein as a cooling/purging gas. It has been observed that by adding 400 torr of cooling/purging gas between etching cycles improves the selectivity of silicon to silicon nitride etching over the prior art.

The addition of inert, or minimally reacting, gas(es) to the gas(es) used for etching has been described in U.S. Pat. Nos. 6,409,876 and 6,290,864. However, unlike the present invention, these patents describe the combination of etching gas with another gas during the etch cycle. The mixing of the additional gas with the etching gas, however, has been shown to greatly reduce etch rate as described in Kirt Reed Williams, "Micromachined Hot-Filament Vacuum Devices," Ph.D. Dissertation, U C Berkeley, May 1997, p. 396.

In the present invention, the separate steps of using concentrated etching gas(es) during the etching cycle, then subsequently cooling the sample with the cooling/purging gas, reduces or avoids continual temperature increases in the sample being etched. This improves etch rate of the sample while maintaining selectivity and reducing other potential forms of damage that may result with high sample temperatures, such as organic film damage or unintended material annealing.

More specifically, the invention is a vapor etching method that includes the steps of (a) locating a sample to be etched in a main chamber; (b) causing atmosphere inside the main chamber to be evacuated therefrom; (c) causing etching gas to be input into the main chamber; (d) causing the etching gas to be evacuated from the main chamber; (e) causing cooling/purging gas to be input into the main chamber; and (f) causing the cooling/purging gas to be evacuated from the main chamber.

Desirably, steps (c)-(f) are repeated until the sample has been etched to a desired extent.

The method can farther include causing the etching gas to be input into an expansion chamber prior to each instance of step (c), wherein step (c) includes causing the etching gas in the expansion chamber to be input into the main chamber.

The method can further include, between step (b) and the first iteration of step (c), the steps of (1) causing cooling/purging gas to be input into the main chamber; (2) causing the cooling/purging gas to be evacuated from the main chamber; and (3) repeating steps (1) and (2) at least one time.

The method can further include, between steps (c) and (d), causing the etching gas to remain in the chamber for a first interval of time; and between steps (e) and (f), causing the cooling/purging gas to remain in the chamber for a second interval of time.

The first interval of time is desirably less than 10 seconds. The second interval of time is desirably less than 20 seconds.

In at least one of steps (b), (d) and (f) the main chamber is evacuated to a pressure between 0.01 and 1.0 torr. In at least one of steps (c) and (e), gas is input into the main chamber to a pressure between 1.0 and 600 torr.

The invention is also a vapor etching system that includes a main chamber for supporting a sample to be etched; an etching gas source in fluid communication with the main chamber via a first gas control valve; a cooling/purging gas source in fluid communication with the main chamber via a second gas control valve; a vacuum pump in fluid communication with the main chamber via a third gas control valve; and a controller operative for controlling said gas control valves whereupon etching gas and cooling/purging gas are alternately input a plurality of times into the main chamber, which is evacuated between the alternate input thereof.

The etching gas and cooling/purging gas from the etching gas source and the cooling/purging gas source, respectively, can alternately be input into the main chamber until the sample is etched to a desired extent.

The system can further include all expansion chamber in fluid communication between the first gas control valve and the main chamber and a fourth gas control valve in fluid communication between the expansion chamber and the main chamber. The controller can be operative for controlling the first and fourth gas valves whereupon, prior to each input of etching gas into the main chamber, said etching gas is input into the expansion chamber.

The system can further include a fifth gas control valve in fluid communication between the expansion chamber and the vacuum pump. The controller can be operative for controlling the gas control valves whereupon gas in the expansion chamber can be evacuated directly by the vacuum pump independently or in concert with the evacuation of gas in the main chamber.

Lastly, the invention is a vapor etching system that includes a main chamber for supporting a sample to be etched; an etching gas source; a cooling/purging gas source; a vacuum pump; a plurality of gas control valves coupled to the main chamber and operative for enabling the main chamber to selectively receive etching gas from the etching gas source, vacuum from the vacuum pump and cooling/purging gas from the cooling/purging gas source; and a controller operative for controlling the gas control valves whereupon the main chamber sequentially receives etching gas from the etching gas source, vacuum from the vacuum pump, cooling/purging gas from the cooling/purging gas source and vacuum from the vacuum pump.

The main chamber can sequentially receive the etching gas from the etching gas source, the vacuum from the vacuum pump, the cooling/purging gas from the cooling/purging gas source and the vacuum from the vacuum pump a plurality of times.

The plurality of gas control valves can include a first gas control valve in fluid communication between the etching gas source and the main chamber; a second gas control valve in fluid communication between the cooling/purging gas source and the main chamber; and a third gas control valve in fluid communication between the main chamber and the vacuum pump.

The system can further include an expansion chamber. The controller can be operative for controlling the gas control valves whereupon the main chamber receives etching gas from the etching gas source via the expansion chamber which receives and temporarily holds said etching gas prior to the main chamber receiving said etching gas.

Alternatively, the plurality of gas control valves can include a first gas control valve in fluid communication between the etching gas source and the expansion chamber; a second gas control valve in fluid communication between the expansion chamber and the main chamber; a third gas control valve in fluid communication between the cooling/purging gas source and the main chamber; and a fourth gas control valve in fluid communication between the main chamber and the vacuum pump. A fifth gas control valve can be provided in fluid communication between the expansion chamber and the vacuum pump.

The etching gas can be xenon difluoride, krypton difluoride or a halogen fluoride. The cooling/purging gas can be helium, nitrogen or argon.

DETAILED DESCRIPTION OF THE INVENTION

Figure 1:
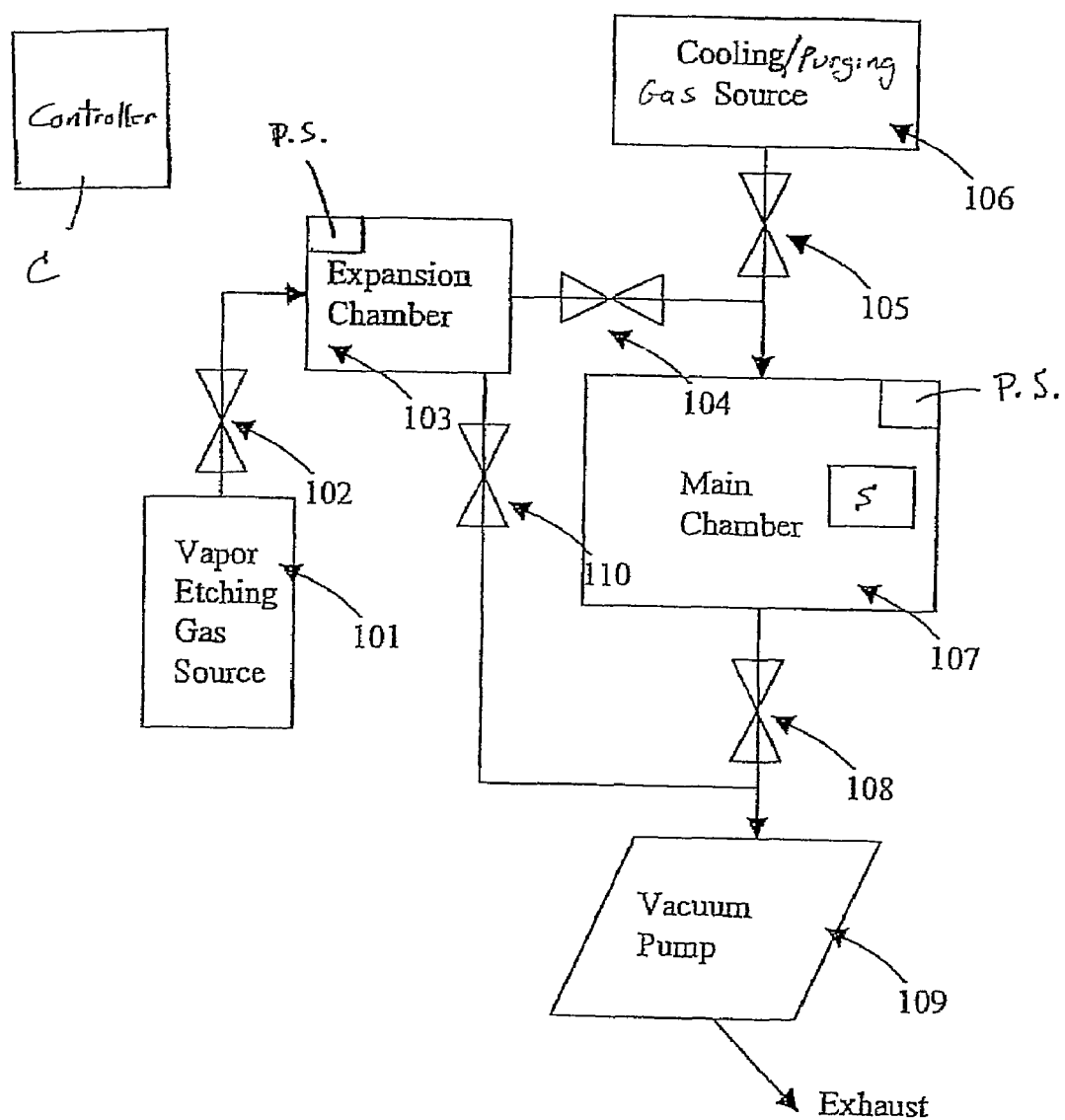
FIG. 1 is a schematic view of a vapor etching system in accordance with the present invention in which a method in accordance with the present invention can be practiced.

With reference to FIG. 1, a vapor etching gas source 101, e.g., a cylinder of etching gas, such as xenon difluoride, is connected to a valve 102, desirably a pneumatically operated valve. Valve 102 is connected to an expansion chamber 103 which acts as an intermediate chamber for regulating the quantity of etching gas in each cycle. In one exemplary embodiment, expansion chamber 103 has a volume of 0.6 liters. However, this is not to be construed as limiting the invention since the volume of expansion chamber 103 can be any suitable and/or desirable volume, e.g., between 0.1 liters and 20 liters or greater.

Expansion chamber 103 can be optionally independently evacuated through valve 110, desirably a pneumatically operated valve. Desirably, a pressure sensor (P.S.), e.g., a capacitance diaphragm gauge, is included in fluid communication with expansion chamber 103. In addition, expansion chamber 103 may have an additional connection and valve (not shown) along with, typically, a needle valve (also not shown) to allow the addition of other gases, such as inert gases, to expansion chamber 103. Expansion chamber 103 is connected to a main vacuum chamber 107 via a valve 104, desirably a pneumatically operated valve. Main chamber 107 may also have a pressure sensor (P.S.), e.g., a capacitance diaphragm gauge, in fluid communication therewith.

A cooling/purging gas source 106, e.g., a cylinder of the cooling/purging gas, is connected to main chamber 107 via a valve 105, which is desirably a pneumatically operated valve. Main chamber 107 is where the sample(s) to be etched is located. Chamber 107 is evacuated via a vacuum pump 109, desirably a dry pump, via valve 108, desirably a pneumatically operated valve. In one exemplary embodiment, main chamber 107 has a volume of 0.6 liters. However, this is not to be construed as limiting the invention since the volume of main chamber 107 can be any suitable or desirable volume, e.g., between 0.1 liter and 20 liters or greater, deemed desirable and/or necessary by one skilled in the art to accommodate the size of the sample(s) to be etched therein.

Other modifications to the aforementioned system design are anticipated such as those described in U.S. Pat. No. 6,887,337, which is incorporated herein by reference. These modifications include, but are not limited to, variable volume expansion chambers, multiple expansion chambers, and multiple gas sources. Also, in some circumstances, such as the use of hazardous gases for cooling, it may be desirable to add a dedicated chamber venting connection rather than solely using valve 105 and cooling/purging gas source 106 for purging and venting main chamber 107.

In addition, the use of other noble gas fluorides, such as krypton difluoride or halogen fluorides, such as bromine trifluoride, are also considered for etching. In addition, combinations of these gases are also considered.

A typical etching sequence is to load sample S into main chamber 107. Main chamber 107 is then evacuated by opening valve 108 which connects vacuum pump 109 to main chamber 107. Desirably, main chamber 107 is pumped down or evacuated, for example, to less than 1 torr, e.g., to approximately 0.3 torr, whereupon valve 108 is closed Main chamber 107 may be further purged of atmosphere by opening valve 105 thereby allowing cooling/purging gas from cooling/purging gas source 106 to flow into main chamber 107 to approximately 400 torr (anywhere from 1 torr to 600 torr would be useful, though) at which point valve 105 is closed and valve 108 is opened whereupon main chamber 107 is pumped down or evacuated again. These purges and pumps are repeated typically three or more times to minimize moisture and undesired atmospheric gases in main chamber 107 which can react with xenon difluoride and other etching gases to form hydrofluoric acid which will attack many non-silicon materials.

At a suitable time, expansion chamber 103 is evacuated by opening valve 110 which connects vacuum pump 109 to expansion chamber 103. Desirably, expansion chamber 103 is pumped down to, for example, less than 1 torr, e.g., to approximately 0.3 torr, whereupon valve 110 is closed. Desirably, the evacuation of expansion chamber 103 by vacuum pump 109 occurs independent of the evacuation of main chamber 107 by vacuum pump 109. However, this is not to be construed as limiting the invention as it is envisioned that the evacuation of expansion chamber 103 and main chamber 107 can occur simultaneously if desired.

Once main chamber 107 has been purged of atmosphere to a sufficient extent, vapor etching gas source 101 is connected to the expansion chamber 103 by opening valve 102. Since expansion chamber 103 has been purged of atmosphere to a sufficient extent, e.g., approximately 0.3 torr or below, etching gas will flow from vapor etching gas source 101 into expansion chamber 103 until the pressure therein desirably reaches between 1 torr and 10 torr (anywhere between 1 torr to 600 torr would be useful, though, wherein higher pressures generally require heating of the gas source). Valve 102 is then closed, followed by valve 104 opening, thereby allowing etching gas in expansion chamber 103 to flow into main chamber 107 which has been pumped by vacuum pump 109 via valve 108 to a pressure below that of expansion chamber 103, e.g., between 0.01 torr and 1 torr. In response to sample S being exposed to etching gas received in main chamber 107 from expansion chamber 103, etching begins on sample S.

Valve 108 is opened after a specified period for etching sample S, which is typically a few seconds, i.e., less than 10 seconds, e.g., approximately 5 seconds. Since valves 104 and 108 are open and since valves 102, 105 and 110 are closed, the pressures in both main chamber 107 and expansion chamber 103 fall in response to the action of vacuum pump 109 acting on expansion chamber 103 and main chamber 107 via open valves 104 and 108. When the pressure in main chamber 107 falls to a set point between 0.01 torr and 1 torr, valves 104 and 108 are closed. The cooling of sample S now begins by opening valve 105 thereby allowing cooling/purging gas, e.g., nitrogen, to flow from cooling/purging gas source 106 into main chamber 107 until the pressure therein reaches 400 torr (any pressure from 1 torr to 600 torr would work) whereupon valve 105 is closed. After valve 105 is closed, the cooling/purging gas is allowed to remain in main chamber 107 for a sufficient period of time, such as, without limitation, less than 20 seconds, e.g., approximately 15 seconds, to reduce the temperature of sample S to a desired temperature, e.g., close to its original or starting temperature. Meanwhile, optionally, the expansion chamber 103 is being evacuated via valve 110 until reaching approximately 0.3 torr. Expansion chamber 103 is then refilled as described above in preparation for the next etching cycle.

Once sufficient cooling time has passed for sample S, main chamber 107 is evacuated by opening valve 108 and the above cycle of etching and cooling is repeated until sufficient etching has been accomplished. Once the etching is complete, sample S can be removed by using the same sequence of pumps and purges that were used for the loading of the sample followed by a venting step where valve 105 is opened until the main chamber pressure reaches atmospheric pressures.

A controller (C) can be provided for automatically controlling the operation of the system shown in FIG. 1. For example, controller C can be connected to each pressure sensor P.S. for detecting the pressure in the corresponding chamber 103 and/or 107 and to each of valves 102, 104, 105, 108 and 110 for controlling the sequence and operation thereof in the manner described above. Controller C can be any suitable and desirable type.

The disclosure of nitrogen as the cooling/purging gas has been used for conveience. However, it is believed that other gases, either individually or in combination, may yield an improvement. For example, the use of helium may provide additional benefit because of its higher thermal conductivity than nitrogen. A higher thermal conductivity will mean that the cooling time required per cycle can be reduced.

The invention has been described with reference to the preferred embodiments. Obvious modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A vapor etching method comprising:
   (a) locating a sample to be etched in a main chamber;
   (b) following step (a), causing atmosphere inside the main chamber to be evacuated therefrom;
   (c) following the evacuation of the main chamber, causing etching gas to be input into the evacuated main chamber;
   (d) following the introduction of etching gas into the evacuated main chamber in step (c), causing the etching gas to be evacuated from the main chamber;
   (e) following the evacuation of the etching gas from the main chamber in step (d), causing cooling/purging gas to be input into the main chamber;
   (f) following the introduction of the cooling/purging gas into the main chamber in step (e), causing the cooling/purging gas to be evacuated from the main chamber; and
   (g) repeating steps (c)-(f) until the sample has been etched to a desired extent, wherein the etching gas is xenon difluoride, krypton difluoride, or a halogen fluoride; and the cooling/purging gas is helium, nitrogen, or argon.

2. The method of claim 1, further including causing the etching gas to be input into an expansion chamber prior to each instance of step (c), wherein step (c) includes causing the etching gas in the expansion chamber to be input into the evacuated main chamber.

3. The method of claim 1, further including, between step (b) and the first iteration of step (c):
   (1) causing cooling/purging gas to be input into the evacuated main chamber;
   (2) causing the cooling/purging gas to be evacuated from the main chamber; and
   (3) repeating steps (1) and (2) at least one time.

4. The method of claim 1, further including:
   between steps (c) and (d), causing the etching gas to remain in the main chamber for a first interval of time; arid
   between steps (e) and (f), causing the cooling/purging gas to remain in the main chamber for a second interval of time.

5. The method of claim 4, wherein:
   the first interval of time is less than 10 seconds; and
   the second interval of time is less than 20 seconds.

6. The method of claim 1, wherein:
   in at least one of steps (b), (d) and (f) the main chamber is evacuated to a pressure between 0.01 and 1.0 torr; and
   in at least one of steps (c) and (e), gas is input into the main chamber to a pressure between 1 and 600 torr.

* * * * *

UNITED STATES PATENT AND TRADEMARK OFFICE
CERTIFICATE OF CORRECTION

| | | |
|---|---|---|
| PATENT NO. | : 7,638,435 B2 | Page 1 of 1 |
| APPLICATION NO. | : 12/064370 | |
| DATED | : December 29, 2009 | |
| INVENTOR(S) | : Lebouitz et al. | |

It is certified that error appears in the above-identified patent and that said Letters Patent is hereby corrected as shown below:

Column 6, Line 53, Claim 4, "time; arid" should read -- time; and --

Signed and Sealed this

Eleventh Day of May, 2010

David J. Kappos
*Director of the United States Patent and Trademark Office*